US011257186B2

(12) United States Patent
Ahn et al.

(10) Patent No.: US 11,257,186 B2
(45) Date of Patent: Feb. 22, 2022

(54) IMAGE PROCESSING APPARATUS, IMAGE PROCESSING METHOD, AND COMPUTER-READABLE RECORDING MEDIUM

(71) Applicant: SAMSUNG ELECTRONICS CO., LTD., Suwon-si (KR)

(72) Inventors: Il-jun Ahn, Suwon-si (KR); Woo-hyun Nam, Seoul (KR); Ki-heum Cho, Suwon-si (KR); Yong-sup Park, Seoul (KR); Tammy Lee, Seoul (KR); Min-su Cheon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/345,616

(22) PCT Filed: Oct. 26, 2017

(86) PCT No.: PCT/KR2017/011932
§ 371 (c)(1),
(2) Date: Apr. 26, 2019

(87) PCT Pub. No.: WO2018/080204
PCT Pub. Date: May 3, 2018

(65) Prior Publication Data
US 2019/0272621 A1 Sep. 5, 2019

(30) Foreign Application Priority Data

Oct. 26, 2016 (KR) .................... 10-2016-0140237

(51) Int. Cl.
*G06T 3/40* (2006.01)
*G06T 5/00* (2006.01)
(Continued)

(52) U.S. Cl.
CPC ............ *G06T 3/4053* (2013.01); *G06F 30/27* (2020.01); *G06T 3/4069* (2013.01); *G06T 5/001* (2013.01); *G06T 5/50* (2013.01)

(58) Field of Classification Search
CPC ........ G06T 3/4053; G06T 5/001; G06F 30/27
See application file for complete search history.

(56) References Cited

U.S. PATENT DOCUMENTS

| 8,144,996 B1 | 3/2012 | Saito et al. |
| 8,483,516 B2 | 7/2013 | Chien et al. |

(Continued)

FOREIGN PATENT DOCUMENTS

| JP | 2012-58773 A | 3/2012 |
| KR | 10-2007-0016909 A | 2/2007 |

(Continued)

OTHER PUBLICATIONS

Google Translation of WO2017166301A1 (Year: 2016).*

(Continued)

*Primary Examiner* — Samantha (Yuehan) Wang
(74) *Attorney, Agent, or Firm* — Sughrue Mion, PLLC

(57) ABSTRACT

An image processing apparatus is disclosed. The present image processing apparatus includes an input unit to which an image is input; and a processor which extracts visual characteristics by reducing an input image and obtains a high-definition image by reflecting extracted visual characteristics on the input image. The disclosure relates to an artificial intelligence (AI) system and application thereof that simulate functions such as cognition and decision-making of a human brain using a machine learning algorithm such as deep learning.

9 Claims, 7 Drawing Sheets

(51) Int. Cl.
*G06T 5/50* (2006.01)
*G06F 30/27* (2020.01)

(56) References Cited

U.S. PATENT DOCUMENTS

| | | | | |
|---|---|---|---|---|
| 8,660,337 | B2* | 2/2014 | Takahashi | G06T 5/008 382/154 |
| 8,989,519 | B2* | 3/2015 | Irani | G06T 3/4053 382/299 |
| 9,378,541 | B2 | 6/2016 | Kim | |
| 9,576,337 | B2 | 2/2017 | Yim | |
| 2011/0206296 | A1* | 8/2011 | Sakaguchi | G06T 3/4053 382/299 |
| 2012/0057798 | A1* | 3/2012 | Saito | G06T 5/005 382/218 |
| 2012/0086850 | A1 | 4/2012 | Irani et al. | |
| 2013/0034299 | A1 | 2/2013 | Lin et al. | |
| 2015/0010245 | A1* | 1/2015 | Kim | G06T 5/002 382/254 |
| 2015/0324952 | A1 | 11/2015 | Namboodiri et al. | |
| 2017/0193635 | A1 | 7/2017 | Zhao et al. | |
| 2017/0345130 | A1* | 11/2017 | Wang | G06T 3/4053 |
| 2020/0058113 | A1* | 2/2020 | Nam | G06T 3/4053 |

FOREIGN PATENT DOCUMENTS

| | | | |
|---|---|---|---|
| KR | 10-2011-0049570 A | | 5/2011 |
| KR | 10-2011-0091991 A | | 8/2011 |
| KR | 10-2012-0088350 A | | 8/2012 |
| KR | 10-2014-0028516 A | | 3/2014 |
| KR | 10-2015-0004167 A | | 1/2015 |
| KR | 10-2015-0129897 A | | 11/2015 |
| KR | 10-2016-0033419 A | | 3/2016 |
| WO | 2015/180053 A1 | | 12/2015 |
| WO | WO2017166301 A1 | * | 4/2016 |

OTHER PUBLICATIONS

Communication dated Jun. 13, 2019 issued by the European Intellectual Property Office in counterpart European Application No. 17866051.0.
Glasner et al., "Super-Resolution from a Single Image", IEEE 12th International Conference on Computer Vision (ICCV), Sep. 2009, pp. 349-356, 8 pages total, XP031672601.
Nercessian et al., "Pixel- and Region-Based Image Fusion Using the Parameterized Logarithmic Stationary Wavelet Transform", SPIE-IS&T, vol. 7881, Feb. 2011, pp. 1-10, 10 pages total, XP060005901.
Hsu, Chih-Chung et al., "Temporally Coherent Super-Resolution of Textured Video via Dynamic Texture Synthesis", IEEE Transactions on Image Processing, 2014. (14 pages total).
Kim, Jiwon et al., "Accurate Image Super-Resolution Using Very Deep Convolutional Networks", 2016 IEEE Conference on Computer Vision and Pattern Recognition (CVPR), Jun. 27, 2016 through Jun. 30, 2016. (10 pages total).
Gatys, Leon A. et al., "Texture Synthesis Using Convolutional Neural Networks", May 27, 2015, arXiv.org. (10 pages total).
Gatys, Leon A. et al., "Image Style Transfer Using Convolutional Neural Networks", 2016 IEEE Conference on Computer Vision and Pattern Recognition (CVPR), Jun. 27, 2016 through Jun. 30, 2016. (11 pages total).
Liu, Yi-Nung et al., "Algorithm and Architecture Design of High Quality Video Up-Scaling Using Database-Free Texture Synthesis", IEEE Transactions on Circuits and Systems for Video Technology, Jul. 2014. (15 pages total).
Kim, Jiwon et al., "Deeply-Recursive Convolutional Network for Image Super-Resolution", arXiv:1511.04491 v1 [cs.CV], Nov. 14, 2015. (9 pages total).
International Search Report dated Feb. 5, 2018 issued by the International Searching Authority in counterpart International Patent Application No. PCT/KR2017/011932. (PCT/ISA/210).
Written Opinion dated Feb. 5, 2018 issued by the International Searching Authority in counterpart International Patent Application No. PCT/KR2017/011932. (PCT/ISA/237).
Communication dated Apr. 17, 2020 issued by the European Patent Office in counterpart European Patent Application No. 17866051.0.
Dumitraş, Adriana et al., "A Texture Replacement Method at the Encoder for Bit-Rate Reduction of Compressed Video", IEEE Transactions on Circuits and Systems for Video Technology, Vo. 13, No. 2, Feb. 1, 2003, pp. 163-175, XP055313160. (13 pages total).
Communication dated Aug. 31, 2020, issued by the Korean Intellectual Property Office in Korean Application No. 10-2016-0140237.
Communication dated Mar. 31, 2021, issued by the Korean Intellectual Property Office in Korean Patent Application No. 10-2016-0140237.
Communication dated Oct. 29, 2021 by the Korean Intellectual Property Office in Korean Patent Application No. 10-2016-0140237.
Communication dated Dec. 6, 2021 by the Intellectual Property Office of India in Indian Patent Application No. 201917020329.
Communication dated Jan. 1, 2022 by the Korean Intellectual Property Office in Korean Patent Application No. 10-2016-0140237.

* cited by examiner

60

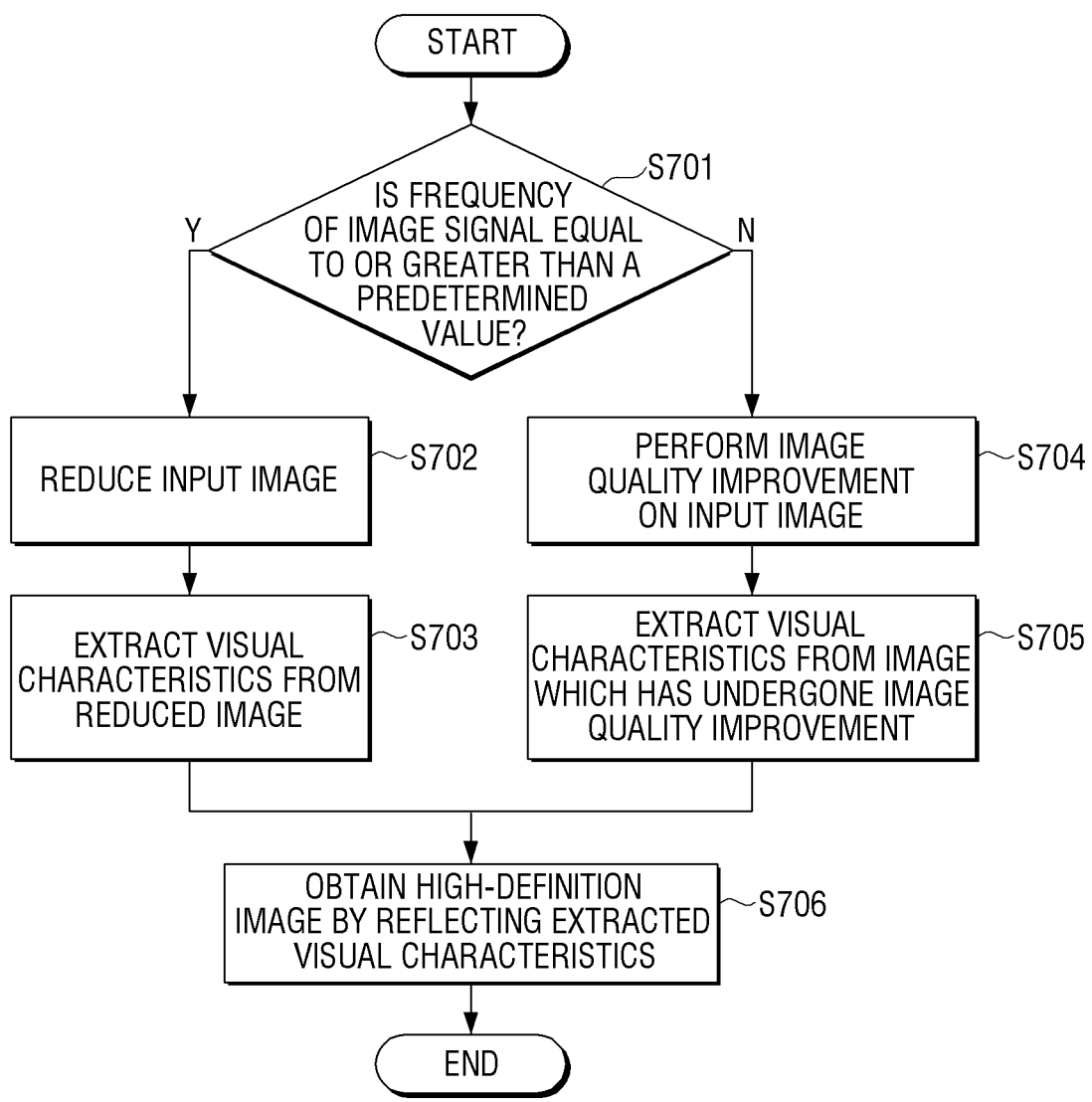

IMAGE PROCESSING APPARATUS, IMAGE PROCESSING METHOD, AND COMPUTER-READABLE RECORDING MEDIUM

TECHNICAL FIELD

This disclosure relates to an image processing apparatus, an image processing method, and a computer-readable recording medium and, more particularly, to an image processing apparatus to obtain a high-definition image, an image processing method, and a computer-readable recording medium.

BACKGROUND ART

An artificial intelligence (AI) system refers to a system which realizes human-level intelligence and a system in which a machine learns, determines, and becomes smarter, unlike conventional rule-based smart systems. AI system shows a more improved recognition rate as iterations are performed, and becomes capable of more accurately understanding user preference. For this reason, conventional rule-based smart systems are gradually being replaced by deep learning-based AI systems.

An AI technology consists of machine learning (deep learning) and element technologies utilizing machine learning.

Machine learning refers to an algorithm technology of classifying/learning the characteristics of input data by itself, and an element technology refers to a technology of simulating functions of a human brain such as cognition and determination by using a machine learning algorithm such as deep learning, and includes fields of technologies such as linguistic understanding, visual understanding, inference/prediction, knowledge representation, operation control, or the like.

Examples of various fields to which AI technologies are applied are as follows. Linguistic understanding refers to a technology of recognizing languages/characters of humans, and applying/processing them, and includes natural speech processing, machine translation, communication systems, queries and answers, voice recognition/synthesis, and the like. Visual understanding refers to a technology of recognizing an object in a similar manner to human vision, and processing the object, and includes recognition of an object, tracking of an object, search of an image, recognition of humans, understanding of a scene, understanding of a space, improvement of an image, and the like. Inference/prediction refers to a technology of determining information and then making logical inference and prediction, and includes knowledge/probability based inference, optimization prediction, preference based planning, recommendation, and the like. Knowledge representation refers to a technology of automatically processing information of human experiences into knowledge data, and includes knowledge construction (data generation/classification), knowledge management (data utilization), and the like. Operation control refers to a technology of controlling autonomous driving of vehicles and movements of robots, and includes movement control (navigation, collision, driving), operation control (behavior control), and the like.

Meanwhile, a lot of studies to improve image quality in terms of a peak signal-to-noise ratio (PSNR), structural similarity (SSIM), or the like, commonly used in quantitative image quality evaluation have been conducted. However, the image quality is influenced by various factors such as human sensitivity or symbol, the technologies developed to date have a limit in improving image quality from a cognitive perspective.

Recently, image quality improvement technologies may be divided into two large categories of a method of not using an external database and a method of using the external database. In the method of not using an external database, super-resolution using very deep convolutional networks (VDSR) was developed. However, in a texture region which may express texture but has a lot of high-frequency components, such as grass, fabric, and the like, performance is still insufficient. In the technologies using an external database, image quality has been improved to some degree even in a texture region, but it is difficult to apply the technologies to a TV or a mobile terminal because a memory of 200 MB or more is used.

Therefore, there is a need for a technology capable of improving the image quality of a texture region of an image without using an external database.

DISCLOSURE

Technical Problem

The disclosure provides an image processing apparatus to obtain a high-definition image by using a low-definition image which is inputted without using external database, an image processing method thereof, and computer-readable recording medium.

Technical Solution

According to an embodiment of the disclosure, an image processing apparatus according to an embodiment of the disclosure includes an input unit to which an image is input, and a processor which extracts visual characteristics by reducing the input image and obtains a high-definition image by reflecting the extracted visual characteristics on the input image.

The processor may reduce the input image using a preset scale factor.

The processor may perform pre-processing to improve image quality of the input image and obtain the high-definition image by reflecting visual characteristics extracted by reducing the pre-processed image into the pre-processed image.

The image processing apparatus may further include a storage for storing a plurality of scale factors corresponding to a plurality of degrees of degradation, and the processor may determine a degree of degradation of the input image based on an image quality improvement rate of the pre-processed image which is measured by comparing with the input image, and reduce the input image using a scale factor corresponding to the determined degree of degradation from among the plurality of stored scale factors.

The processor may arrange the plurality of reduced images to correspond to a size of the input image and extract visual characteristics from the arranged image.

The processor may obtain a high-definition image by reflecting the extracted visual characteristics to only a part of a region in the input image.

The part of a region may have a frequency of an image signal which is greater than or equal to a predetermined value.

The image processing apparatus may further include a display unit to display the obtained high-definition image.

The image processing apparatus may further include a communicator to transmit the obtained high-definition image to a display device.

An image processing method according to an embodiment of the disclosure includes receiving an input of an image, reducing the input image, extracting visual characteristics from the reduced image, and obtaining a high-definition image by reflecting the extracted visual characteristics to the input image.

The reducing may include reducing the input image using a predetermined scale factor.

The method may further include performing pre-process to improve image quality of the input image, and the reducing may include reducing the pre-processed image.

The method may further include storing a plurality of scale factors corresponding to a plurality of degrees of degradation of an image, and the reducing may include determining a degree of degradation of the input image based on an image quality improvement rate of the image of which the image quality is improved, the improvement rate being measured by comparing with the input image, and reducing the input image using a scale factor corresponding to the determined degree of degradation from among the plurality of stored scale factors.

The extracting may include arranging the plurality of reduced images to correspond to a size of the input image and extracting visual characteristic from the arranged image.

The obtaining may include obtaining a high-definition image by reflecting the extracted visual characteristics to only a part of a region in the input image.

In this case, the part of a region may have a frequency of an image signal which is greater than or equal to a predetermined value.

The method may further include displaying the obtained high-definition image.

The method may further include transmitting the obtained high-definition image to a display device.

A computer-readable recording medium including a program to execute an image processing method according to an embodiment of the disclosure includes receiving an input of an image, reducing the input image, extracting visual characteristics from the reduced image, and obtaining a high-definition image by reflecting the extracted visual characteristics to the input image.

BEST MODE

Figure 1:
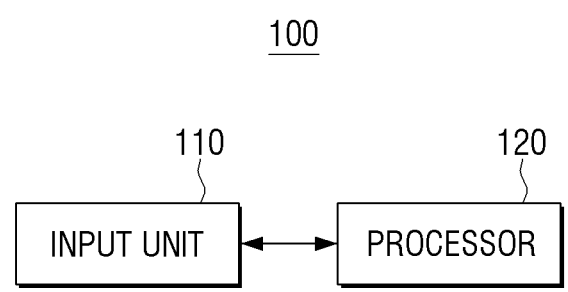
FIG. 1 is a block diagram to describe a simple configuration of an image processing apparatus according to an embodiment of the disclosure.

Hereinbelow, diverse embodiments of the disclosure will be described in a greater detail with reference to the attached drawings.

General terms that are currently widely used were selected as terms used in exemplary embodiments of the disclosure in consideration of functions in the disclosure, but may be changed depending on the intention of those skilled in the art or a judicial precedent, the emergence of a new technique, and the like. In addition, in a specific case, terms arbitrarily chosen by an applicant may exist. In this case, the meaning of such terms will be mentioned in detail in a corresponding description portion of the disclosure. Therefore, the terms used in exemplary embodiments of the disclosure should be defined on the basis of the meaning of the terms and the contents throughout the disclosure rather than simple names of the terms.

Since the disclosure may be variously modified and have several exemplary embodiments, specific exemplary embodiments of the disclosure will be illustrated in the drawings and be described in detail in the detailed description. However, it is to be understood that the disclosure is not limited to specific exemplary embodiments, but includes all modifications, equivalents, and substitutions without departing from the scope and spirit of the disclosure. When it is decided that a detailed description for the known art related to the disclosure may obscure the gist of the disclosure, the detailed description will be omitted.

Terms 'first', 'second', and the like, may be used to describe various components, but the components are not to be construed as being limited by the terms. The terms are used only to distinguish one component from another component.

Singular forms are intended to include plural forms unless the context clearly indicates otherwise. It will be further understood that terms "include" or "formed of" used in the present specification specify the presence of features, numerals, steps, operations, components, parts, or combinations thereof mentioned in the present specification, but do not preclude the presence or addition of one or more other features, numerals, steps, operations, components, parts, or combinations thereof.

In exemplary embodiments of the disclosure, a 'module' or a '~er/~or' may perform at least one function or operation, and be implemented by hardware or software or be implemented by a combination of hardware and software. In addition, a plurality of 'modules' or a plurality of '~ers/~ors' may be integrated in at least one module and be implemented by at least one processor (not illustrated) except for a 'module' or a '~er/or' that needs to be implemented by specific hardware.

Hereinafter, exemplary embodiments of the disclosure will be described in detail with reference to the accompanying drawings so that those skilled in the art to which the disclosure pertains may easily practice the disclosure. However, the disclosure may be implemented in various different forms and is not limited to exemplary embodiments described herein. In addition, in the drawings, portions unrelated to the description will be omitted to obviously describe the disclosure, and similar portions will be denoted by similar reference numerals throughout the specification.

Hereinafter, the disclosure will be described in detail with reference to the drawings.

FIG. 1 is a block diagram to describe a simple configuration of an image processing apparatus according to an embodiment of the disclosure.

Referring to FIG. 1, an image processing apparatus 100 includes an input unit 110 and a processor 120. Here, the image processing apparatus 100 may be implemented with a server and a set-top for processing an input image and transmitting the image to a separate display. The embodiment is not limited thereto and may be a display device including a TV, PC, mobile device including a display unit which may be displayed by the device itself.

The input unit 110 may receive a low-definition image. Specifically, the input unit 110 may receive an image from an outside wirelessly or by wire, or receive an input of an image which is to be processed by the selection of a user among the plurality of stored images. For example, the input unit 110 may receive an input of an image through an antenna or a cable, or receive an input of an image selected by a user from a storage (not shown).

The processor 120 may obtain a high-definition image by up-scaling an image inputted by the input unit 110. Specifically, the processor 120 may reduce the input low-definition image and extract visual characteristics of the reduced image, and obtain a high-definition image by reflecting the extracted visual characteristics to the input low-definition image.

Here, the up-scaling means to correct an increased pixel in order to realize a high-definition image in a low-definition image. When the size of a screen is the same, more vivid and a clearer image than an original image may be obtained. Even when the size of a screen is increased, an image which is not degraded in image quality than the original screen may be obtained.

The visual characteristics are features which a user may recognize when seeing an image by eyes, including a texture characteristic which represents feeling felt not only from attributes of an image such as brightness, hue, darkness, chroma, contrast, and the like of an image, but also a frequency form of an image signal of each area in the image, a shape and density of an edge included in the image, arrangement of colors, or the like.

As described above, according to the disclosure, a memory to be used may be reduced, as it is possible to obtain a high-definition image using the visual characteristics extracted by reducing a low-definition image without external database. In addition, there is an effect of improving the quality of a conventional texture region which is composed of a high-frequency region and thus has little up-scaling effect.

The processor 120 may reduce an input image using a predetermined scale factor. Here, the scale factor is a factor for determining the extent of reduction of the input image and may be between 0 and 1. At this time, the predetermined scale factor may be a value predetermined by machine learning. For example, when there is a high-definition original image, the processor 120 may determine the scale factor so that an image obtained by processing a low-definition image is most similar to the original image. At this time, the processor 120 may determine the scale factor for processing the low-definition image so as to be most similar to the original image by performing the same operation for a plurality of original images. A specific method of determining the scale factor using similarity will be further described with reference to FIG. 4.

Meanwhile, the processor 120 may determine the scale factor according to the degradation degree of the low-definition image. Specifically, the image processing apparatus 100 may pre-store a plurality of scale factor information corresponding to each of a plurality of degradation degree of the image. At this time, the plurality of the scale factor information may be stored in the form of a look-up table. The method for determining a scale factor according to the degradation degree of an image will be described in detail with reference to FIG. 5.

The processor 120 may improve an image quality of an image which is inputted before reducing the input image. To be specific, the processor 120, according to an algorithm to be used for improving the existing image quality, may improve an image quality of an image primarily and then perform image processing for improving image quality according to an embodiment of the disclosure.

In the meantime, the processor 120 may extract visual characteristics from the reduced image itself, but the embodiment is not limited thereto, and the visual characteristic may be extracted from an image in which the reduced plurality of images are arranged to correspond to the size of an input image. For example, when the input image is reduce using the scale factor 0.5, the processor 120 may arrange the reduced image in 2×2 in order to correspond to the size of the input image, and extract the visual characteristics from the arranged image.

Through this, the visual characteristics of each corresponding pixel may be reflected, and thus, without an additional scaling step in the process of obtaining a high-definition image by applying the extracted visual characteristic to the input image, an error which may occur may be reduced.

The processor 120 may obtain a high-definition image by reflecting the visual characteristics extracted from the reduced image into an input image. At this time, the processor 120 may divide the input image into a plurality of regions having a size corresponding to the reduced image, thereby obtaining a high-definition image by means of applying the extracted visual characteristics to each of the divided regions.

In the meantime, the processor 120 may obtain a high-definition image by repeatedly applying the extracted visual characteristics to the input image.

The processor 120 may obtain a high-definition image by reflecting the extracted visual characteristic to only a part of an area from among the input image. This will be described in greater detail with reference to FIGS. 6 and 7.

Figure 2:
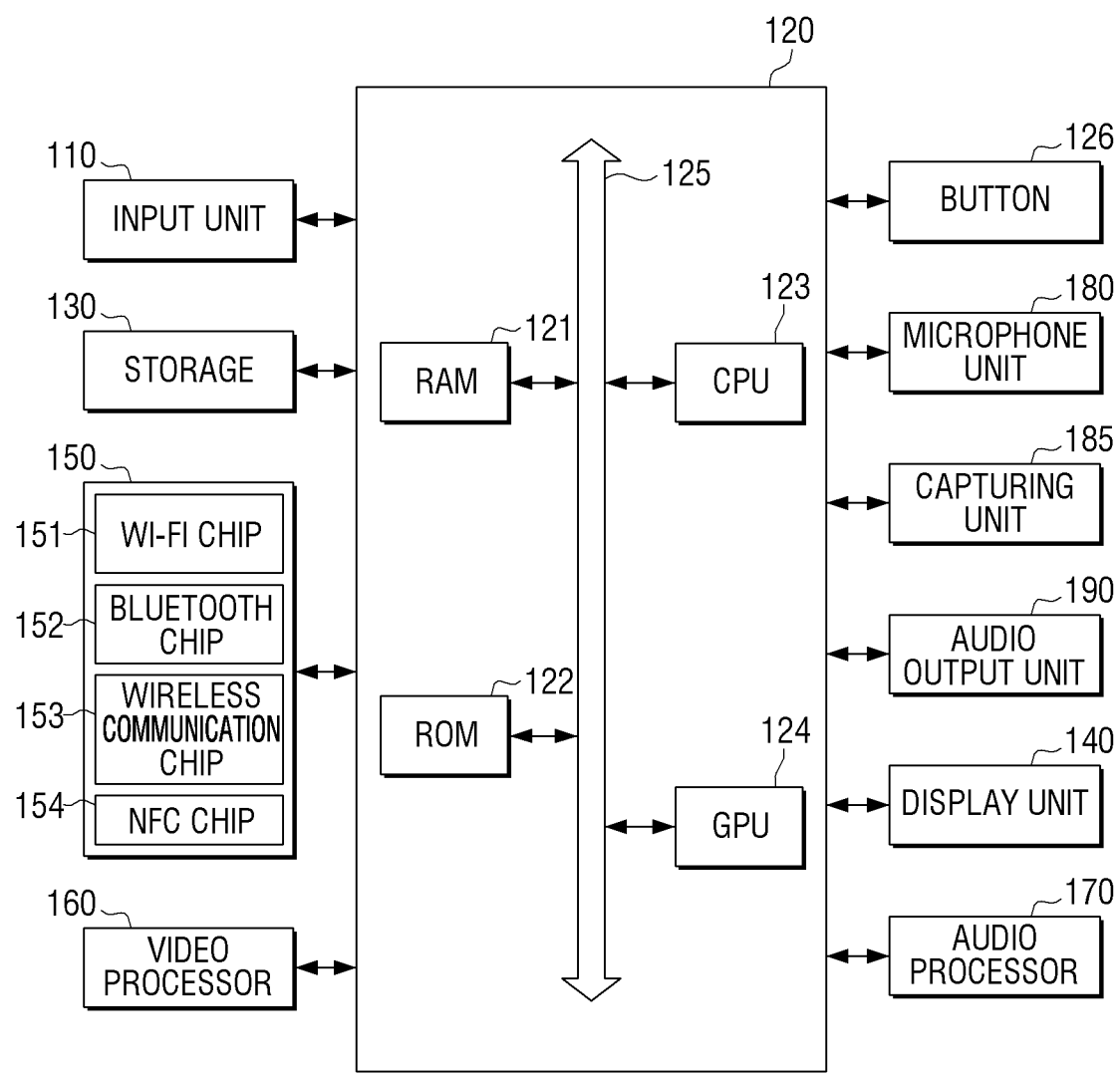
FIG. 2 is a block diagram to describe a specific configuration of the image processing apparatus according to an embodiment of the disclosure.

FIG. 2 is a block diagram to describe a specific configuration of the image processing apparatus according to an embodiment of the disclosure.

Referring to FIG. 2, the image processing apparatus 100 may include an input unit 110, a processor 120, a storage 130, a display unit 140, a communicator 150, a video processor 160, an audio processor 170, a button 126, a microphone unit 180, a capturing unit 185, and an audio output unit 190. Here, the input unit 110 and the processor 120 are the same as the configuration shown in FIG. 1, and a repeated description thereof is omitted.

The storage 130 may store various programs and data required for the operation of the image processing apparatus 100. Specifically, the storage 130 may store the scale factor to be used in reducing an input image. At this time, the stored scale factor is calculated by a manufacturer through the machine learning, and may be pre-stored at the time of publication or updated through periodic firmware upgrade. The storage 130 may store an algorithm for deriving the scale factor.

The storage 130 may store a plurality of low-definition images to be up-scaled to a high-definition image. The processor 120 may obtain a high-definition image for a low-definition image selected by a user from among the plurality of stored low-definition images.

The storage 130 may store information on the scale factor corresponding to the degree of degradation of an image. At this time, the scale factor according to the degree of degradation may be stored in a look-up table format.

The storage 130 may store program and data for up-scaling the low-definition image. By this, the processor 120 may obtain a high-definition image with an input low-definition image using the stored program and data, and in some cases, the processor 120 may determine the scale factor to be used in the up-scaling process.

The display unit 140 may display an obtained high-definition image. The display unit 140 may be implemented with various types of displays such as a liquid crystal display (LCD), organic light emitting diodes (OLED) display, plasma display panel (PDP), or the like. Inside the display unit 140, a driving circuit which may be implemented as an a-si TFT, low temperature poly silicon (LTPS) TFT, organic TFT (OTFT), a backlight unit, or the like. In addition, the display unit 140 may be implemented as a flexible display.

The display unit 140 may include a touch sensor for sensing a touch gesture of a user. The touch sensor may be implemented with various types of sensors such as static electricity type, pressure-sensitive type, piezoelectric type, and the like. The static electricity type uses a dielectric coated on the surface of the display unit so that, when a part of the body of the user is touched on the surface of the display unit 140, minute electricity which is excited to the human body is sensed and a touch coordinate is calculated. The pressure-sensitive type includes two electrode plates embedded in the display unit 140. When a user touches a screen, upper and lower plates of the touched point are in contact with each other, a current flow is sensed, and a touch coordinate is calculated by sensing the current. In addition, when the image processing apparatus 100 supports a pen input function as well, the display unit 140 may sense a user gesture using an input means such as a pen, besides a user's finger. When an input means is a stylus pen including a coil inside, the image processing apparatus 100 may include a magnetic field sensing sensor capable of sensing a magnetic field changed by a coil inside the stylus pen. Accordingly, not only a touch gesture but also a proximity gesture, that is, hovering, may be sensed.

It has been described that a display function and a gesture sensing function are performed in the same configuration, but the functions may be performed in different configurations. According to various embodiments, the display unit 140 may not be provided in the image processing apparatus 100.

The communicator 150 is a configuration to communicate with various types of external devices according to various types of communication methods. The communicator 150 includes a Wi-Fi chip 151, a Bluetooth chip 152, a wireless communication chip 153, and a near-field communication (NFC) chip. The processor 120 communicates with various external devices using the communicator 150.

To be specific, the communicator 150 may receive a low-definition image from an external device and transmit a high-definition image obtained by the processor 120 to an external device such as a separate display device.

The Wi-Fi chip 151 and the Bluetooth chip 152 perform communication in a Wi-Fi method and a Bluetooth method, respectively. When using the Wi-Fi chip 151 and the Bluetooth chip 152, various connection information such as the SSID and a session key is transmitted and received, and communication is connected using the connection information, and then various kinds of information may be transmitted and received. The wireless communication chip 153 means a chip performing communication according to various communication standards such as institute of electrical and electronics engineers (IEEE), Zigbee, $3^{rd}$ generation (3G), 3rd generation partnership project (3GPP), long term evolution (LTE), or the like. The NFC chip 154 means a chip which operates with the NFC method using 13.56 MHz bandwidth from among various radio frequency identification (RF-ID) frequency bandwidths such as 135 kHz, 13.56 MHz, 433 MHz, 860-960 MHz, 2.45 GHz, or the like.

The processor 120 may include a random-access memory 121, read-only memory 122, central processing unit 123, graphic processing unit 124, and a bus 125. The RAM 121, ROM 122, CPU 123, GPU 124, or the like, may be interconnected through the bus 125.

The CPU 123 may access the storage 130 to perform a booting sequence using an O/S stored in the storage 130. The CPU 123 may perform various operations by using various types of programs, contents, and data, etc. stored in the storage 130.

The ROM 122 may store a command set for system booting. When a turn-on command is input and thus the power is supplied, the CPU 123 may copy the O/S stored in the storage 130 to RAM 121 according to the commands stored in the ROM 122, and boot the system by executing the O/S. When the booting is completed, the CPU 123 copies various programs stored in the storage 130 to the RAM 121, and executes the programs copied in the RAM 121 to perform various operations.

When booting of the image processing apparatus 100 is completed, the graphic processing unit (GPU) 124 displays a UI on the display unit 140. To be specific, the GPU 124 may obtain a screen including various objects such as an icon, an image, a text, using a calculator (not illustrated) and a renderer (not illustrated). The calculator may calculate attribute values, such as coordinate values, shapes, sizes, and colors of the objects, according to a layout of the screen. The renderer may obtain a screen including the objects in various layouts based on the attribute values calculated by the calculator. The screen (or a user interface window) obtained by the renderer is provided to the display unit 140, and is displayed on a main display area and a sub-display area, respectively.

The video processor 160 is a configuration to process video data included in contents stored in the storage 130. The video processor 160 may perform various image processes such as decoding, scaling, noise filtering, frame rate converting, resolution converting, or the like with respect to the video data.

The audio processor 170 is a configuration to process contents received through the communicator 150, or audio data included in the contents stored in the storage 130. The audio processor 170 may perform various audio signal processes such as decoding, amplifying, noise filtering, or the like with respect to audio data.

When a reproduction application of the multimedia content is executed, the processor 120 may reproduce the contents by driving the video processor 160 and the audio processor 170. At this time, the display unit 140 may display an image frame obtained by the video processor 160 on at least one area among a main display area and a sub-display area.

An audio output unit 190 outputs the audio data obtained by the audio processor 170.

The button 126 may be various types of buttons such as a mechanical button, a touch pad, a wheel, and the like formed in an arbitrary area such as a front surface portion, a side surface portion, and a back surface portion of the main body of the image processing apparatus 100.

A microphone unit 180 is a configuration to receive a user voice or other sound and convert the voice or sound to audio data. The processor 120 may store the user voice inputted through the microphone unit 180 in the storage 130 by using the user voice in a calling process or converting to audio data. In the meantime, the microphone unit 180 may be a stereo microphone which receives a sound from a plurality of positions.

The capturing unit 185 is a configuration to capture a still image or a moving image according to a control of a user. The capturing unit 185 may be implemented to be plural such as a front camera, a back camera, or the like. As described above, the capturing unit 185 may be used as a means to acquire an image of a user in an embodiment to track a user's gaze.

When the capturing unit 185 and the microphone unit 180 are provided, the processor 120 may perform a control operation according to a user voice which is inputted through the microphone unit 180 or a user motion which is recognized by the capturing unit 185. That is, the image processing apparatus 100 may operate in a motion control mode or a voice control mode. In the case of the operation in a motion control mode, the processor 120 may capture a user by activating the capturing unit 185, track a motion change of the user, and perform a control operation corresponding thereto. In the case of the operation in a voice control mode, the processor 120 may analyze a user voice which is outputted through the microphone unit 180 and operate in a voice recognition mode to perform a control operation according to the analyzed user voice.

In the image processing apparatus 100 having a motion control mode or a voice control mode, a voice recognition technology or a motion recognition technology may be used in various embodiments described above. For example, when a user takes a motion as if selecting an object displayed on a home screen or pronounces a voice command corresponding to the object, the image processing apparatus 100 may determine that the corresponding object is selected, and perform a control operation matched to the object.

Figure 3:
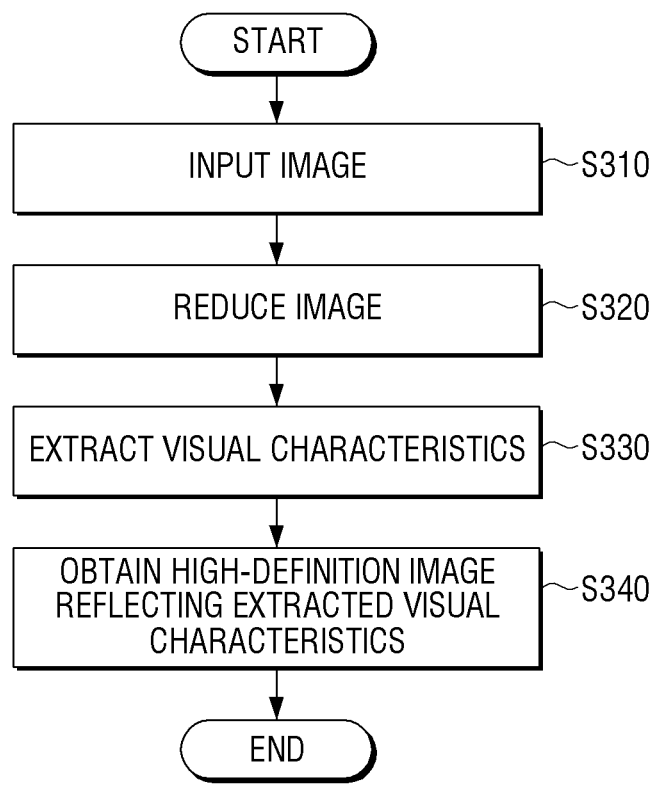
FIG. 3 is a flowchart schematically illustrating an image processing method according to an embodiment of the disclosure.

Although not shown in FIG. 3, according to some embodiments, a USB port to which a USB connector may be connected, a headset, a mouse, a plurality of external input ports for connecting to various external terminals such as a local area network (LAN), a digital multimedia broadcasting (DMB) chip for receiving and processing a DMB signal, and various sensors may be further included in the image processing apparatus 100.

FIG. 3 is a flowchart schematically illustrating an image processing method according to an embodiment of the disclosure.

Referring to FIG. 3, the image processing apparatus may receive an input of an image in step S310. To be specific, the input image may be received from an external device or selected by a user among a plurality of images stored in the image processing apparatus.

Although not shown, the image processing apparatus may perform pre-processing for improving the image quality of the input image. Specifically, the image processing apparatus may perform preprocessing on the input image using the up-scaling method of the existing image. For example, an image processing apparatus may detect an edge based on a signal change of an image, and process the image to include a sharper edge by reducing the width of the detected region or increasing the intensity. This is merely an embodiment, and the image processing apparatus may perform pre-processing for improving the image quality of an input image in various ways.

In the meantime, according to an existing up-scaling method, an up-scaling effect of a texture region in which a signal in an image is composed of high frequency may be insignificant. However, the image quality of the texture region may be also improved through the image processing according to the disclosure as described below.

Then, the image processing apparatus may reduce the input image in step S320. Specifically, the image processing apparatus may reduce an input image using a scale factor. At this time, the scale factor may be a preset value or a value determined according to the input image. Meanwhile, when the scale factor is a predetermined value, a method for deriving the scale factor will be described in detail with reference to FIG. 4. Meanwhile, when the scale factor is a value determined according to the input image, a method for deriving the scale factor will be described in detail with reference to FIG. 5.

In the meantime, when the pre-processing for improving the image quality of the input image is performed, the image processing apparatus may reduce a pre-processed image using the scale factor.

Then, the image processing apparatus may extract the visual characteristics from the reduced image in step S330. Specifically, the image processing apparatus may extract the texture feature which may be felt from not only attributes of an image such as brightness, hue, darkness, chroma, contrast, and the like of a reduced image, but also a frequency form of an image signal of each area in the image, a shape and density of an edge included in the image.

Though not illustrated, the image processing apparatus may, prior to the step of extracting the visual characteristic, arrange the reduced plurality of images to correspond to the sizes of the input images and extract the visual characteristic from the arranged images.

When the pre-processing to improve an image quality of the input image is performed, the reduced image may be a pre-processed image, and the image processing apparatus may extract the visual characteristic from the reduced image after the pre-processing is performed.

Then, the image processing apparatus may obtain a high-definition image by reflecting the extracted visual characteristics in step S340. Specifically, the image processing apparatus may divide the input image into a plurality of regions having a size corresponding to the reduced image, and obtain a high-definition image by applying the visual characteristics extracted from the reduced image to each of the divided regions. In the meantime, when the visual characteristics are extracted from an image in which a plurality of reduced images are arranged, the image processing apparatus may obtain a high-definition image by applying the visual characteristics to a position corresponding to each of the images arranged in the input image. At this time, the image processing apparatus may obtain a high-definition image by repeatedly applying the extracted visual characteristics to the input image.

When pre-processing for improving an image quality of the input image is performed, the image processing apparatus may obtain a high-definition image by reflecting the extracted visual characteristics to the pre-processed image.

As described above, according to the disclosure, a memory and time to be used for up-scaling may be reduced, as it is possible to obtain a high-definition image using the visual characteristics extracted by reducing a low-definition image without external database. In addition, there is an effect of improving the quality of a conventional texture region, as well, which is composed of a high-frequency region and thus has little up-scaling effect.

Figure 4:
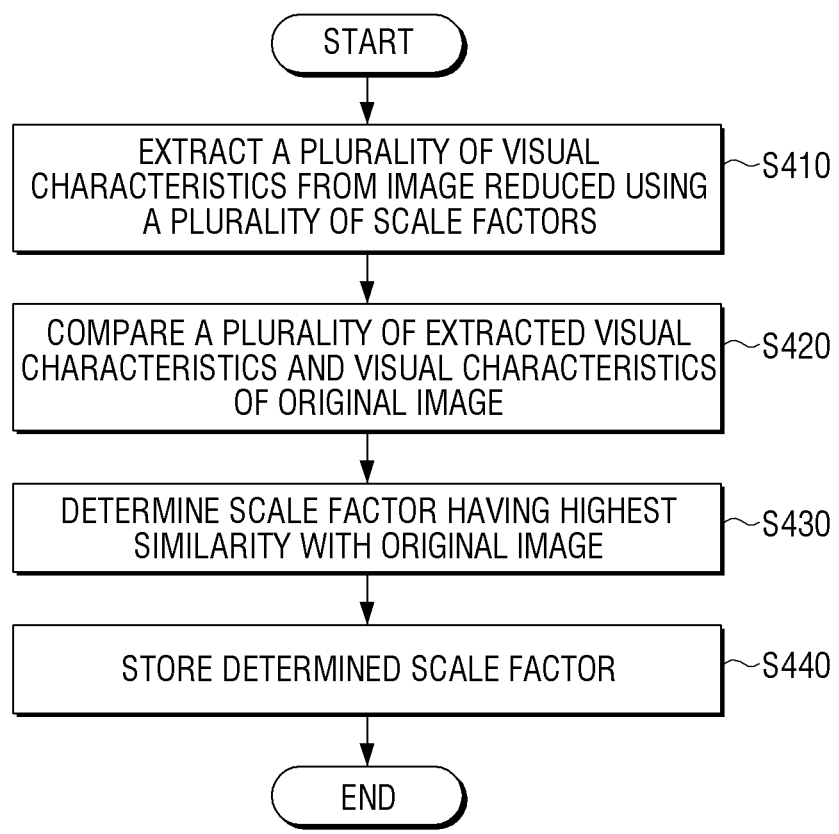
FIG. 4 is a flowchart illustrating a method for determining a scale factor according to an embodiment of the disclosure.

FIG. 4 is a flowchart illustrating a method for determining a scale factor according to an embodiment of the disclosure. Although not illustrated in FIG. 4, the image processing apparatus may further include the step of receiving or storing an original image and a low-definition image of the original image, first.

Referring to FIG. 4, the image processing apparatus may extract a plurality of visual characteristics from an image reduced by using a plurality of scale factors in step S410. To be specific, the image processing apparatus reduce the input low-definition images using a plurality of scale factors, respectively, and extract the visual characteristics from the reduced image.

For example, the image processing apparatus may extract the visual characteristics from the plurality of reduced images that are reduced using five scale factors of 0.1, 0.3, 0.5, 0.7, and 0.9. The image processing apparatus may obtain five images by respectively reflecting the extracted visual characteristics to the input image.

At this time, the image processing apparatus may arrange a plurality of images reduced by each scale factor to correspond to the size of the input image, and extract the visual characteristics from each of the arranged images. For example, the image processing apparatus may arrange a plurality of images reduced by a scale factor of 0.1 to a size corresponding to the input image, and extract the visual characteristics from the arranged image. In the same manner, the image processing apparatus may extract the visual characteristics for each of the scale factors of 0.3, 0.5, 0.7, and 0.9. In the meantime, in actual implementation, the scale factors are not limited to the values described in the above examples, and the number of scale factors may also be four or less and six or more.

Then, the image processing apparatus may compare the extracted visual characteristics and the visual characteristics of the original image, respectively in step S420. Specifically, the image processing apparatus may calculate feature maps of various sizes for the visual characteristics of the original image and the extracted plurality of visual characteristics using a multi-layer technique. Here, the layer is related to the size of the image. As the layer index increases, the size of the entire image gets smaller. For example, if the layer index is small, a feature map for a local range in the image is calculated, and if the layer index is large, a feature map for a wider range in the image is calculated.

Based on the calculated feature map, Gram matrix $G_{ij}^l$ for measuring a relation among the feature maps on each layer may be calculated as shown in Equation (1) below.

$$G_{ij}^l = \sum_k F_{ik}^l F_{jk}^l \qquad (1)$$

Here, l is a layer index, i and j are feature map indexes, and k is a pixel index.

In order for the visual characteristics extracted from the reduced image to be similar to the visual characteristics of the original image, Gram matrices calculated from each layer need to be similar. Therefore, the image processing apparatus first calculates a difference $E_L$ of Gram matrices of the visual characteristics of the original image and the extracted visual characteristics on each layer L, as described in Equation (2).

$$E_L = \Sigma(\hat{G}^L - G^L)^2 \qquad (2)$$

Here, $G^L$ and $\hat{G}^L$ represent the Gram matrices of the visual characteristics of the original image and the extracted visual characteristics on the $L^{th}$ layer, respectively.

Then, the image processing apparatus, as described in Equation (3), may calculate an average $L(\vec{x},\hat{\vec{x}})$ of the difference of Gram matrices of pixels which mutually correspond to the visual characteristics of the original image and the extracted visual characteristics.

$$L(\vec{x}, \hat{\vec{x}}) = \sum_{l=0}^{L} \omega_l E_l \qquad (3)$$

Here, $\vec{X}$ and $\hat{\vec{X}}$ represent pixel positions of the visual characteristics of the original image and the extracted visual characteristics, respectively.

The image processing apparatus may determine the scale factor corresponding to the visual characteristics having the highest degree of similarity with the visual characteristics of the original image among the plurality of extracted visual characteristics in step S430. Here, having the highest degree of similarity means that the average of the difference of the Gram matrices is minimum. That is, the image processing apparatus may determine a scale factor which corresponds to the visual characteristics of which the average of the difference of the Gram matrix with the visual characteristics of the original image is minim, as the scale factor to be used for reducing an image to be inputted afterwards.

In the meantime, in actual implementation, a scale factor which is best suited for obtaining a high-definition image that is similar to the original image may be determined by repeating the above-described processes several times.

The image processing apparatus may store the determined scale factor in step S440. In the meantime, the process of storing the scale factor may be omitted for some cases.

It has been described that a preset scale factor to be used to reduce an input low-definition image is performed by the image processing apparatus, but in actual implementation, the above process may be performed by an external device such as a server, and it may be implemented such that the image processing apparatus receives a determined scale factor from an external device and uses the scale factor.

As described above, by determining a scale factor for obtaining a high-definition image which is most similar to the original image through machine learning for repeatedly comparing with the original image, when a low-definition image is to be input afterwards, a high-definition image which expresses texture most successfully may be obtained without using an external database.

Figure 5:
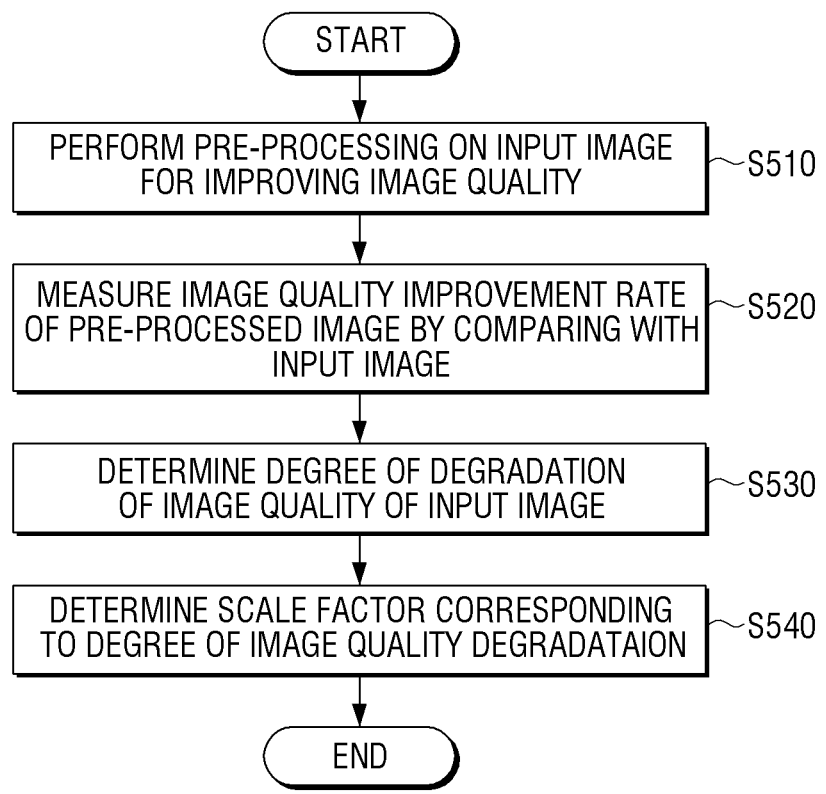
FIG. 5 is a flowchart illustrating a method for determining a scale factor according to another embodiment of the disclosure.

FIG. 5 is a flowchart illustrating a method for determining a scale factor according to another embodiment of the disclosure. Although not illustrated in FIG. 5, the image processing apparatus may further include the step of storing the scale factor corresponding to the degree of image degradation as a look-up table.

Referring to FIG. 5, the image processing apparatus may perform pre-processing to an input image to improve image quality in step S510. To be specific, the image processing apparatus may perform pre-processing to an input image using the existing up-scaling method. For example, the image processing apparatus may process an image to include clearer edge by detecting an edge based on a signal change of an image, reducing width of the detected area, or increasing intensity of the detected area. This is merely exemplary, and the image processing apparatus may perform pre-processing to improve image quality of the image which is inputted by various methods.

The image processing apparatus may measure an image quality improvement rate of the pre-processed image by comparing the pre-processed image with the input image in step S520. Specifically, the image processing apparatus may measure the image quality improvement rate by comparing the image quality performance of the input image and the image quality performance of the pre-processed image.

The image processing apparatus may determine a degree of image quality degradation of the input image in step S530. Specifically, the image processing apparatus may determine the degree of image quality degradation degree of the input image using the measured image quality improvement rate of the pre-processed image. For example, the image processing apparatus may determine that the better the image quality improvement rate of the pre-processed image is, the severe the image quality degradation degree of the input image is.

The image processing apparatus may determine the scale factor corresponding to the determined image quality degradation degree in step S540. Specifically, the image processing apparatus may determine the scale factor corresponding to the determined degree of image quality degradation in the stored look-up table as the scale factor to be used to reduce the input image.

As described above, by determining the scale factor according to various degrees of image quality degradation of various input images, a high-definition image which most successfully expresses texture may be obtained without using external database.

Figure 6:
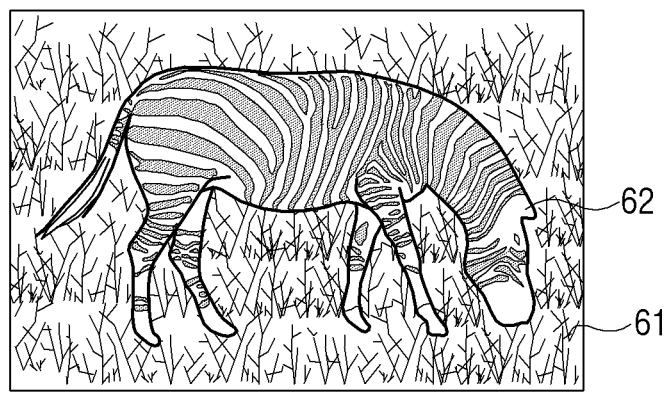
FIG. 6 is a view to describe an image of which a region is divided according to an embodiment of the disclosure, and, FIG. 7 is a flowchart to describe an image processing method as illustrated in FIG. 6.

FIG. 6 is a view to describe an image of which a region is divided according to an embodiment of the disclosure.

Referring to FIG. 6, an example of an input image 60 includes a zebra 62 standing on the grass 61. Specifically, the input image 60 has a lot of edges and clear distinction is difficult. The input image may include the grass 61 area of which an image signal has high frequency and the zebra 62 area which has comparatively clear edge and has a low-frequency image signal.

In this case, the image processing apparatus may obtain a high-definition image by reflecting the visual characteristics extracted from the reduced image only to a part of an area of the input image 60. Specifically, the image processing apparatus may divide an area of which image signal has high-frequency and an area of which image signal has low-frequency and perform different image processing, respectively. This will be further described with reference to FIG. 7.

FIG. 7 is a flowchart to describe an image processing method as illustrated in FIG. 6.

Referring to FIG. 7, the image processing apparatus may be divide the input image into a plurality of areas according to frequency of the image signal. To be specific, the image processing apparatus may determine whether the frequency of the image signal of the input image is equal to or greater than a preset image in step S701.

If it is determined that the frequency of the image signal is equal to or greater than a predetermined value in step S701-Y, the image processing apparatus may reduce the input image in step S702. At this time, the image processing apparatus may reduce the input image by using a scale factor determined according to a predetermined scale factor or a degree of deterioration of the input image.

Although not shown, the image processing apparatus may reduce a pre-processed image after performing pre-processing to improve the quality of the input image.

Then, the image processing apparatus may extract the visual characteristics from the reduced image in step S703. This has been described in FIGS. 1 and 3, and will not be further described.

In the meantime, if the image processing apparatus determines that the frequency of the image signal is less than a predetermined value in step S701-N, the image processing apparatus may perform a process of improving the image quality of the input image in step S704.

The image processing apparatus may extract the visual characteristics from image which has undergone the image improvement process in step S705. The detailed operation is substantially the same as the operation of extracting visual characteristics from the reduced image, and redundant description will be omitted.

The image processing apparatus may obtain the high-definition image by reflecting the extracted visual characteristics to the input image in step S706. Specifically, the image processing apparatus may apply the visual characteristics extracted from the reduced image to a region in the input image where the frequency of the image signal is equal to or greater than a predetermined frequency, and apply the visual characteristics extracted from the image which has undergone the image quality improvement process to a region in the input image where the frequency of the image signal is less than a predetermined frequency.

In the meantime, an image is processed in a form of applying a scale factor or not applying a scale factor by classifying the input image into two regions, but in actual implementation, it can be implemented in a form of applying different scale factors, and image process may be performed by classifying the input image into three regions or more.

It may be implemented to apply different scale factors for each frame.

As described above, according to the characteristics of an image, various scale factors are applied, and accordingly, even if a low-definition image in which a texture region representing texture and a non-texture area are mixed is input, an image having higher definition, as a whole, may be obtained.

According to various embodiments as described above, a high-definition image may be obtained using visual characteristics which are extracted by reducing a low-definition image without external database. Therefore, memory and time required for up-scaling may be reduced. In addition, there may be an effect that the image quality of a texture region which is composed of a high-frequency region and thus has little up-scaling effect can be improved.

The various embodiments described above may be implemented in a recordable medium that can be read by computer or a similar device using software, hardware, or a combination thereof. In accordance with a hardware implementation, the embodiments described in this disclosure may be implemented by using at least one of application specific integrated circuits (ASICs), digital signal processors (DSPs), digital signal processing devices (DSPDs), programmable logic devices (PLDs), field programmable gate arrays (FPGAs), a processor, a controller, a micro-controller, a microprocessor, and an electrical unit for performing other functions. In some cases, the embodiments described in this disclosure may be implemented as the processor 120 itself. According to a software implementation, embodiments such as the procedures and functions described herein may be implemented with separate software modules. Each of the software modules may perform one or more of the functions and operations described herein.

The controlling method of the display device according to various embodiments of the disclosure may be stored in a non-transitory readable medium. The non-transitory readable medium may be embedded and used in various devices.

The non-transitory computer readable medium refers to a medium that stores data semi-permanently rather than storing data for a very short time, such as a register, a cache, a memory or etc., and is readable by an apparatus. In detail, the aforementioned various applications or programs may be stored in the non-transitory computer readable medium, for example, a compact disc (CD), a digital versatile disc (DVD), a hard disc, a Blu-ray disc, a universal serial bus (USB), a memory card, a read only memory (ROM), and the like, and may be provided.

The foregoing exemplary embodiments and advantages are merely exemplary and are not to be construed as limiting the disclosure. The present teaching may be readily applied to other types of apparatuses. Also, the description of the exemplary embodiments of the disclosure is intended to be illustrative, and not to limit the scope of the claims, and many alternatives, modifications, and variations will be apparent to those skilled in the art.

What is claimed is:

1. An image processing apparatus comprising:
    a memory configured to store a plurality of scale factors for determining an extent of reduction of an input image;
    an input unit to which the image is input; and
    a processor configured to:
        receive an input image through the input unit,
        perform pre-processing to improve an image quality of the input image,
        determine a degree of degradation of the input image based on an image quality improvement rate of the pre-processed image which is measured by comparing the pre-processed image with the input image,
        obtain a plurality of reduced images by reducing the pre-processed image based on a scale factor corresponding to the determined degree of degradation from among the plurality of scale factors stored in the memory,
        obtain a texture feature corresponding to the pre-processed image, and a plurality of texture features corresponding to the plurality of reduced images,
        identify, among the plurality of texture features corresponding to the plurality of reduced images, a texture feature having a minimum difference from the texture feature corresponding to the pre-processed image, and
        obtain an output image by applying the identified texture feature to a plurality of first areas of the pre-processed image, the plurality of first areas being a portion of the pre-processed image in which a frequency of an image signal corresponding to the pre-processed image is greater than or equal to a preset frequency, wherein a size of the plurality of first areas corresponds to a size of the plurality of reduced images.

2. The image processing apparatus of claim 1, wherein the plurality of scale factors are different from each other.

3. The image processing apparatus of claim 1, wherein the processor is further configured to arrange the plurality of reduced images to correspond to a size of the input image and obtain a first texture feature from the plurality of arranged images.

4. The image processing apparatus of claim 1, further comprising:
    a display unit configured to display the obtained output image.

5. The image processing apparatus of claim 1, further comprising:
    a communicator configured to transmit the obtained output image to a display device.

6. An image processing method comprising:
    receiving an input image;
    performing pre-processing to improve an image quality of the input image,
    determining a degree of degradation of the input image based on an image quality improvement rate of the pre-processed image which is measured by comparing the pre-processed image with the input image,
    obtaining a plurality of reduced images by reducing the pre-processed image based on a scale factor corresponding to the determined degree of degradation from among a plurality of scale factors for determining an extent of reduction of the pre-processed image;
    obtaining a texture feature corresponding to the pre-processed image and a plurality of texture features corresponding to the plurality of reduced images;
    identifying, among the plurality of texture features corresponding to the plurality of reduced images, a texture feature having a minimum difference from the texture feature corresponding to the pre-processed image, and
    obtaining an output image by applying the identified texture feature to a plurality of first areas of the pre-processed image, the plurality of first areas being a portion of the pre-processed image in which a frequency of an image signal corresponding to the pre-processed image is greater than or equal to a preset frequency, wherein a size of the plurality of first areas corresponds to a size of the plurality of reduced images.

7. The method of claim 6, wherein the plurality of scale factors are different from each other.

8. The method of claim 6, further comprising:
    storing the plurality of scale factors corresponding to a plurality of degrees of degradation of an image.

9. The method of claim 6, wherein the obtaining comprises arranging the plurality of reduced images to correspond to a size of the input image and obtaining a first texture feature from the plurality of arranged images.

* * * * *